(12) United States Patent
Sheeran

(10) Patent No.: US 7,365,552 B2
(45) Date of Patent: Apr. 29, 2008

(54) SURFACE MOUNT PACKAGE FAULT DETECTION APPARATUS

(75) Inventor: John Sheeran, Baden (CA)

(73) Assignee: Research In Motion Limited, Waterloo, Ontario (CA)

( * ) Notice: Subject to any disclaimer, the term of this patent is extended or adjusted under 35 U.S.C. 154(b) by 0 days.

(21) Appl. No.: 11/494,502

(22) Filed: Jul. 28, 2006

(65) Prior Publication Data

US 2008/0024150 A1 Jan. 31, 2008

(51) Int. Cl.
  *G01R 31/02* (2006.01)
  *G01R 31/28* (2006.01)
(52) U.S. Cl. .................................. 324/755; 324/158.1
(58) Field of Classification Search ............... 73/573, 73/588, 815; 324/537, 754–758, 158.1
  See application file for complete search history.

(56) References Cited

U.S. PATENT DOCUMENTS

| | | | | |
|---|---|---|---|---|
| 3,824,462 A | * | 7/1974 | Vinsani ...................... 324/555 |
| 3,896,935 A | * | 7/1975 | Hjelle et al. ................. 209/573 |
| 4,410,227 A | * | 10/1983 | Prunella et al. ............. 439/296 |
| 5,533,398 A | * | 7/1996 | Sakurai ........................ 73/573 |
| 5,963,039 A | * | 10/1999 | Borutta et al. ............... 324/537 |
| 6,100,707 A | * | 8/2000 | Baumann et al. ........... 324/761 |
| 6,249,114 B1 | * | 6/2001 | Sakai .......................... 324/72.5 |
| 6,777,924 B2 | * | 8/2004 | Flach et al. ............... 324/158.1 |
| 6,927,588 B1 | * | 8/2005 | Snelgrove ................... 324/755 |
| 7,129,726 B2 | * | 10/2006 | Tashiro et al. .............. 324/754 |
| 2005/0077907 A1 | * | 4/2005 | Parker et al. ............... 324/538 |
| 2005/0164530 A1 | * | 7/2005 | Yates et al. .................. 439/73 |
| 2006/0022685 A1 | * | 2/2006 | Audette et al. ............. 324/754 |

OTHER PUBLICATIONS

ANONYMOUS:"SMT Circuit Board Solder Joint Stress-inducing Test Assembly" Research Disclosure, Mason Publications, Hampshire, GB, vol. 333, No. 4, Jan. 1992, XP007117194, ISSN: 0374-4353
Liguore, S. et al.: Vibration Fatique of Surface Mount Technology (SMT) Solder Joints, Proceedings of the Annual Reliability and Maintainability Symposium, Washington, Jan. 16-19, 1995, New York, IEEE, U.S. Jan. 16, 1995, pp. 18-26, XP000538584, ISBN: 0-7803-2471-4.

* cited by examiner

*Primary Examiner*—Ha Tran Nguyen
*Assistant Examiner*—Joshua Benitez
(74) *Attorney, Agent, or Firm*—Perry + Currier Inc.

(57) ABSTRACT

A fault detection apparatus for surface mount packages is provided. The apparatus can include a retainer for releasably securing a circuit board such as a printed circuit board having an electrical component mounted thereon via a ball grid array surface mount package. When mounted within the apparatus, a test signal is applied to the electrical component. The apparatus includes a mechanical actuator, such as a solenoid, for applying a reciprocating force to the circuit board. The reciprocating force can disturb a defect in the ball grid array manifesting as a mechanically unreliable connection at one of the balls where an electrically intermittent connection is occurring. By disturbing the mechanically unreliable connection, the electrically intermittent connection can be caused to fail altogether and thereby reveal the defect as a test signal is carried through the printed circuit board.

15 Claims, 9 Drawing Sheets

SURFACE MOUNT PACKAGE FAULT DETECTION APPARATUS

TECHNICAL FIELD

The present application relates generally to surface mount packaging and more particularly relates to an apparatus for detecting faults in a surface mount package.

BACKGROUND

Surface mount packages are a well known means of constructing electronic circuits where components are mounted directly to circuit boards. Many types of surface mount packages are known, including dual in-line packages, quad in-line packages and grid arrays.

As integrated circuit technology shrinks, the need arises for smaller and denser mechanical interfaces between the integrated circuits and the circuit boards on which they are mounted. Dual in-line, quad in-line and to grid arrays reflect the natural progression in increased density. However, with greater density comes a greater number of points of potential failure. Grid arrays are perhaps the most problematic when it comes to detecting failures, as the actual failure can occur within the array, between the integrated circuit and the circuit board, making detection (let alone repair) of the fault nearly impossible. These and other drawbacks of grid arrays, particularly ball grid arrays, are discussed at http://nepp.nasa.gov/index_nasa.cfm/773 "Ball Grid Array (BGA) and http://nepp.nasa.gov/index_nasa.cfm/777, "Recommendations for BGA/CSP Qualification and Flight Implementation" as published by NASA Electronic Parts and Packaging Program (NEPP).

CALTEX Scientific, 192-T Technology Dr., Irvine, Calif. 92618 USA sells various products such as BGA Scope BH-1000 system for inspection and measurement of BGA and Micro BGA. The BGA Scope BH-1000 is essentially a high-resolution camera connected to a computer-monitor that can be used to navigate within the BGA to visually inspect each ball for defects. Unfortunately, this type of system is extremely complex and requires some degree of access to the integrated circuit in order to orient the camera so as to be able to perform the inspection.

A still further known way to detect failures in BGAs can be found in Lizheng Zhang, I. Charles Ume, Juergen Gamalski and Klaus-Peter Galuschki, 2006, Detection of Flip Chip Solder Joint Cracks Using Correlation Coefficient and Auto-Comparison Analyses of Laser Ultrasound Signals, IEEE Transactions on Components and Packaging Technologies, vol. 29, No. 1, p. 13-19. ("Zhang") Again, however, Zhang requires complex equipment and skill in order to detect failures in a BGA.

BRIEF DESCRIPTION OF THE DRAWINGS

Embodiments will now be discussed, by way of example only, with reference to the attached Figures in which.

DETAILED DESCRIPTION

Figure 1:
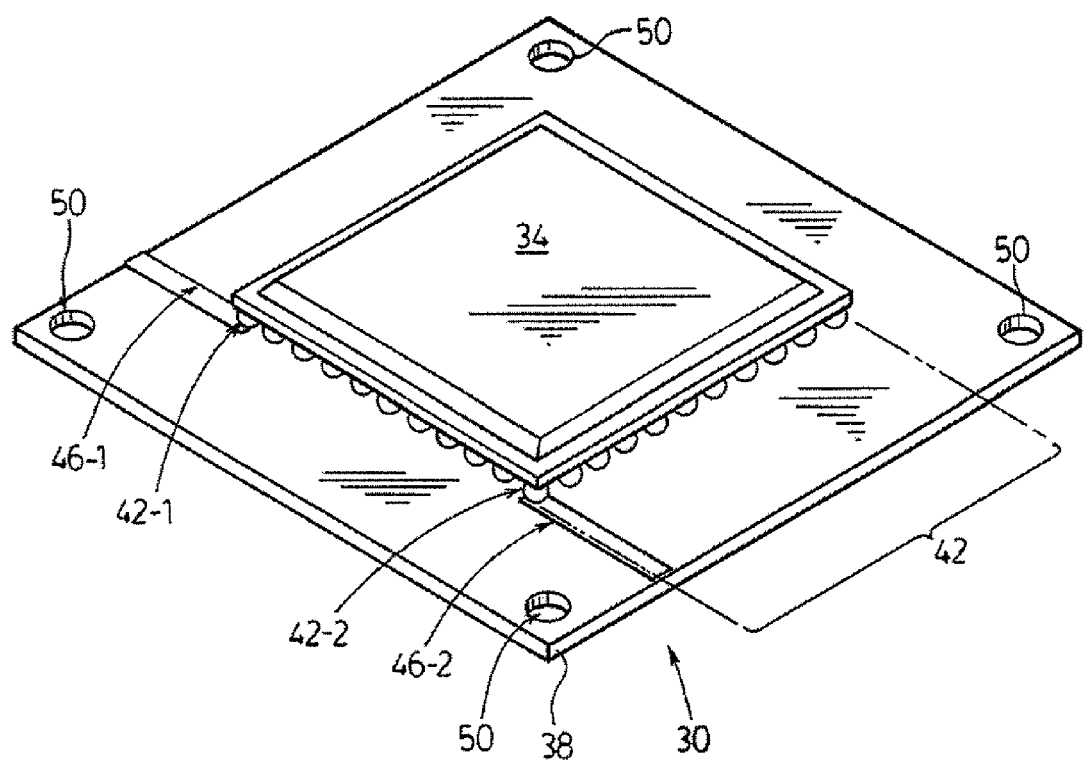
FIG. 1 is a perspective view of a schematic representation of circuit board assembly including an integrated circuit having a ball grid array mounted on a circuit board.

An aspect provides a fault detection apparatus for detecting a fault in a surface mount package of a circuit board assembly. The circuit board assembly comprises an electrical component mounted to a surface of a circuit board via the surface mount package. The apparatus comprises a retainer for releasably securing the circuit board assembly. The apparatus also comprises a mechanical actuator for applying a mechanical force to the circuit board when the circuit board assembly is secured within the retainer and while a test signal is passed through the circuit board. The mechanical force is for disturbing a mechanical defect in the surface mount package to thereby reveal, using results from the test signal, an electrically intermittent connection in the surface mount package.

The surface mount package can be a dual in-line package, a quad in-line package, a ball grid array or any other type of surface mount package.

The mechanical actuator can be at least one solenoid. The solenoid can comprise a core portion and a rod. The rod is movable between a retracted position and an extended position. The rod is disposed in relation to the circuit board such that changing between the positions causes deflections in the circuit board. The rod can be disposed beneath the surface mount package. The rod can include a cap made from an Electrostatic Compliant material. The apparatus of can further comprise a signal generator for applying a varying signal to the solenoid to cause the rod to cycle between the positions. The signal generator can operate at a frequency of between about 120 and 170 Hz. Or, the signal generator can operate at a frequency of between about 130 and 160 Hz. Or the signal generator can operate at a frequency of about 150 Hz.

The circuit board assembly can include a plurality of electrical components mounted via a respective surface mount package. In this situation the apparatus can comprise a plurality of mechanical actuators respective to one or more of the electrical components.

The retainer of the fault detection apparatus can include a base plate. The base plate can include a plurality of mounting-posts projecting from the base-plate that align with a corresponding plurality of mounting-holes in the circuit board.

The mounting posts can include a male thread that projects above the mounting-holes and wherein the retainer further includes a plurality of crown nuts with female threads complementary to the male threads. The crown nuts are for securing the circuit board to the mounting posts.

Instead of, or in addition to the crown nuts, the retainer can further comprise a clamp for applying a force to the circuit board and thereby secure the circuit board between the clamp and the base plate.

Another aspect provides a method for detecting a fault in a surface mount package of a circuit board assembly. The circuit board assembly comprises an electrical component mounted to a surface of a circuit board via the surface mount package. the method comprises:

securing the circuit board assembly within a retainer.

applying a test signal through the circuit board.

applying a mechanical force to the circuit board for disturbing any mechanical defects in the surface mount package. and, using results from the test signal, revealing an electrically intermittent connection in the surface mount package as a result of the step of applying the mechanical force.

A fault detection apparatus for surface mount packages is provided. The apparatus can include a retainer for releasably securing a circuit board such as a printed circuit board having an electrical component mounted thereon via a ball grid array surface mount package. When mounted within the apparatus, a test signal is applied to the electrical component. The apparatus includes a mechanical actuator, such as a solenoid, for applying a reciprocating force to the circuit board. The reciprocating force can disturb a defect in the ball grid array manifesting as a mechanically unreliable connection at one of the balls where an electrically intermittent connection is occurring. By disturbing the mechanically unreliable connection, the electrically intermittent connection can be caused to fail altogether and thereby reveal the defect as a test signal is carried through the printed circuit board. Advantageously a non-destructive test for failures in surface mount packages is effected.

Figure 2:
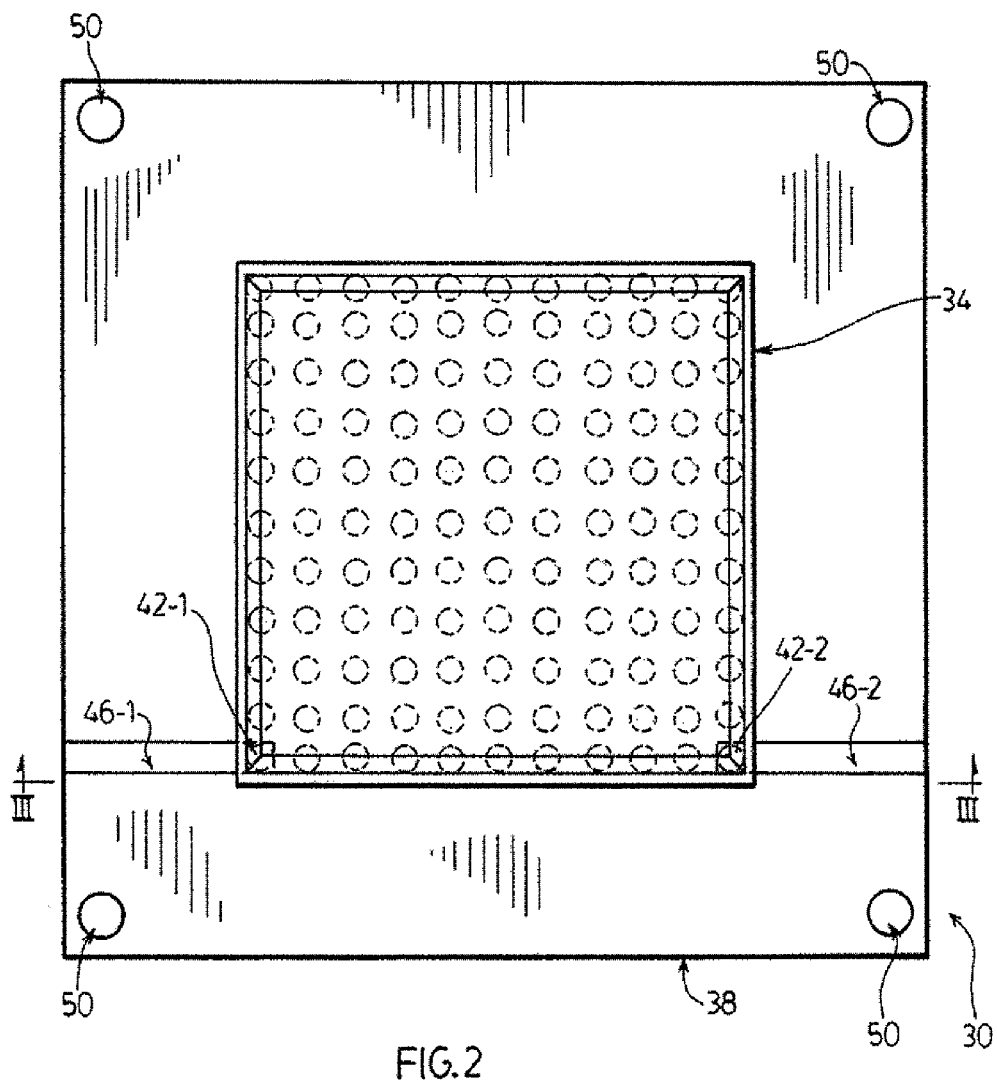
FIG. 2 is a top view of the circuit board assembly of FIG. 1.
Figure 3:
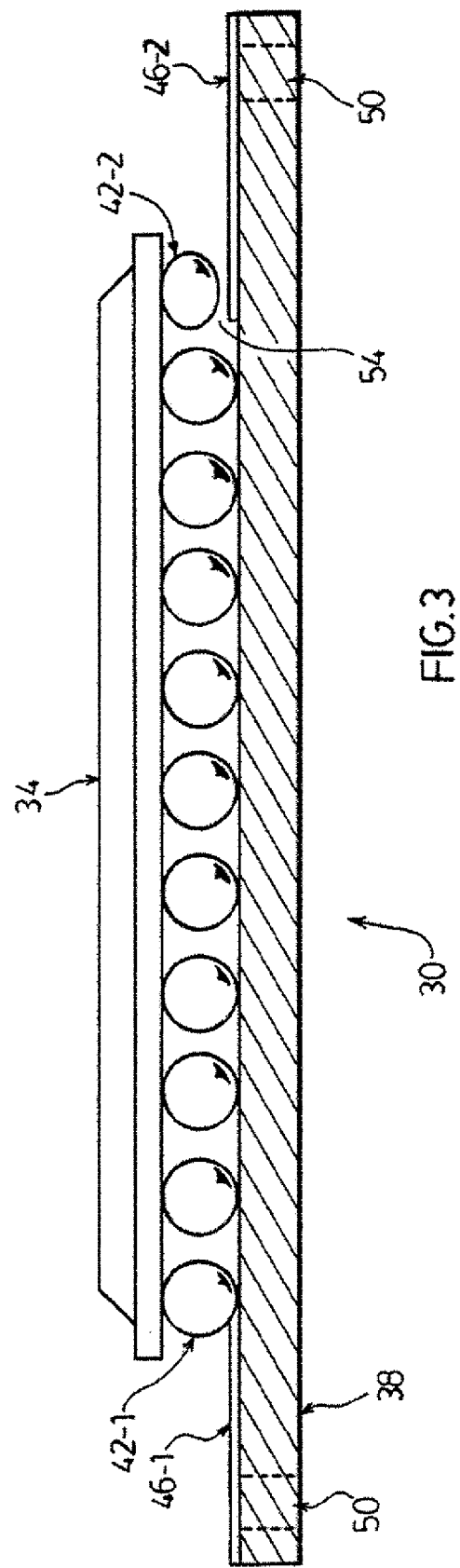
FIG. 3 is a sectional view of the circuit board assembly of FIG. 1 through the lines III-III in FIG. 2.

Referring now to FIGS. 1-3, a circuit board assembly is indicated generally at 30. Assembly 30 comprises an integrated circuit ("IC") 34 mounted to a circuit board 38 via a ball grid array ("BGA") 42. While assembly 30 includes IC 34, it is to be understood that any type of electrical component that utilizes a BGA, such as BGA 42, is contemplated.

BGA 42 comprises a plurality of balls (hereafter referred to generically as balls 42), two of which are individually labeled in FIGS. 1 through 3 as 42-1 and 42-2.

Circuit board 38 can be any type of known wafer for mounting electrical components, including a printed circuit board. Circuit board 38 includes a plurality of traces for carrying electrical signals along the surface of board 38. For simplicity, only two exemplary traces (hereafter referred to generically as traces 46) are shown in FIGS. 1 through 3 and are labeled as trace 46-1 and trace 46-2. Traces 46 are made from a metal such as copper and may be etched or printed onto the surface of the board 38.

Circuit board 38 also includes a mounting hole 50 through each corner. Mounting holes 50 are configured to receive a fastener or the like therethrough in order to secure circuit board 38 when board 38 is placed within a chassis or housing of an electrical device that incorporates board 38.

As understood by those skilled in the art, each ball 42 serves as an electrical conductor between traces 46 and the silicon-circuitry within IC 34. As best seen in FIG. 3, in assembly 30, trace 46-1 is respective to ball 42-1 and intended to provide electrical connectivity between one edge of board 38 and ball 42-1, while trace 46-2 is respective to ball 42-2 and intended to provide electrical connectivity between an opposite edge of board 38 and ball 42-2. Of note, however, in FIG. 3 it can be seen that while ball 42-1 is connected to trace 46-1, a gap 54 exists between ball 42-2 and trace 46-2. The size of gap 54 is pronounced in FIG. 3 for the purposes of explanation, but those skilled in the art will appreciate that gap 54 is not likely to be visible to the naked eye. In any event, gap 54 presents itself as a fault or defect in assembly 30. Gap 54 represents a lack of a substantially reliable mechanical connection between trace 46-2 and ball 42-2. However, due to nature of gap 54, it is possible that intermittent electrical contact can exist between trace 46-2 and ball 42-2. Depending on the nature of gap 54, it may be referred to as an interfacial or brittle fracture.

Figure 4:
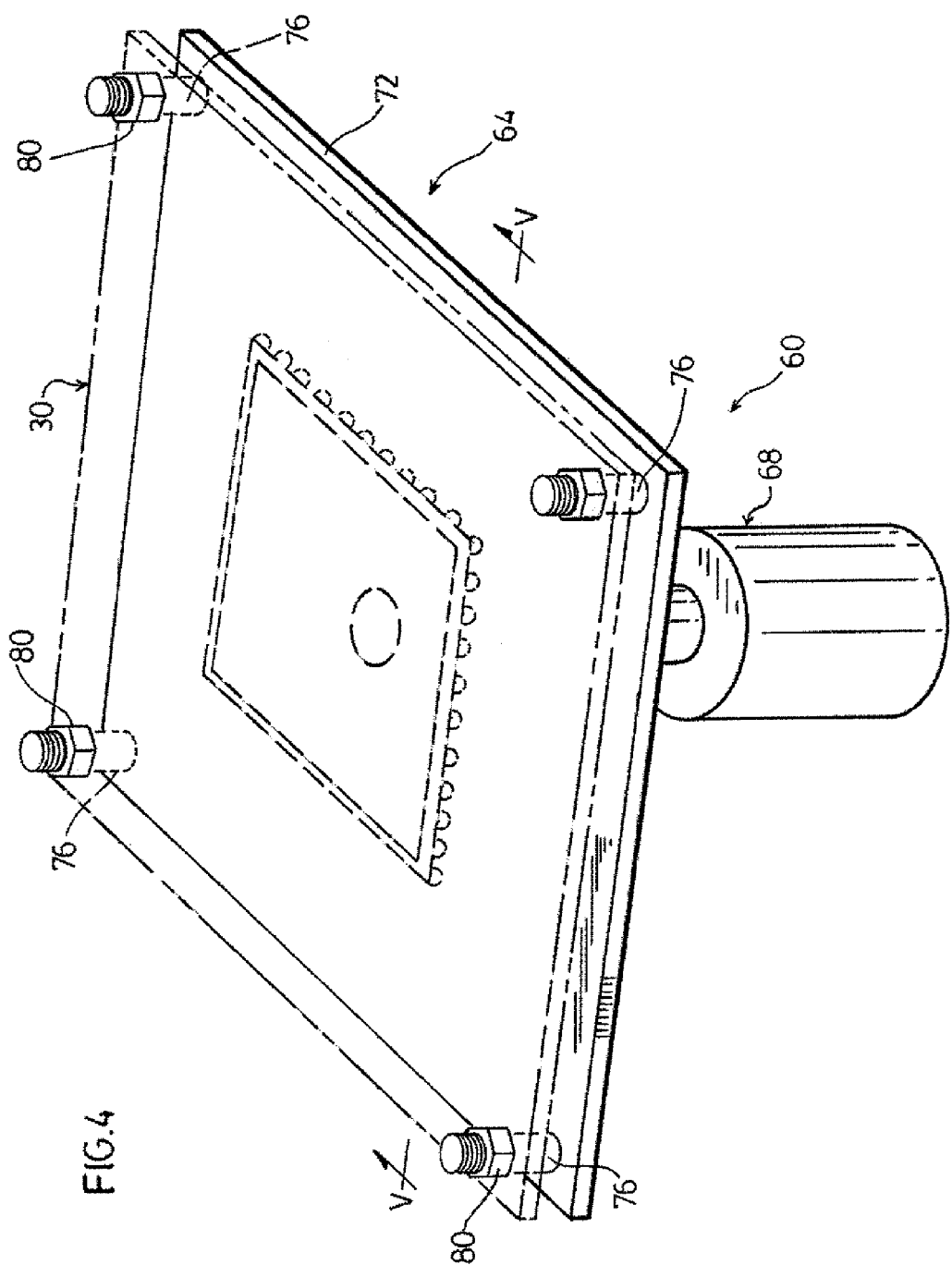
FIG. 4 is a top perspective view of a fault detection apparatus with the circuit board assembly of FIG. 1 shown in dashed-lines.
Figure 5:
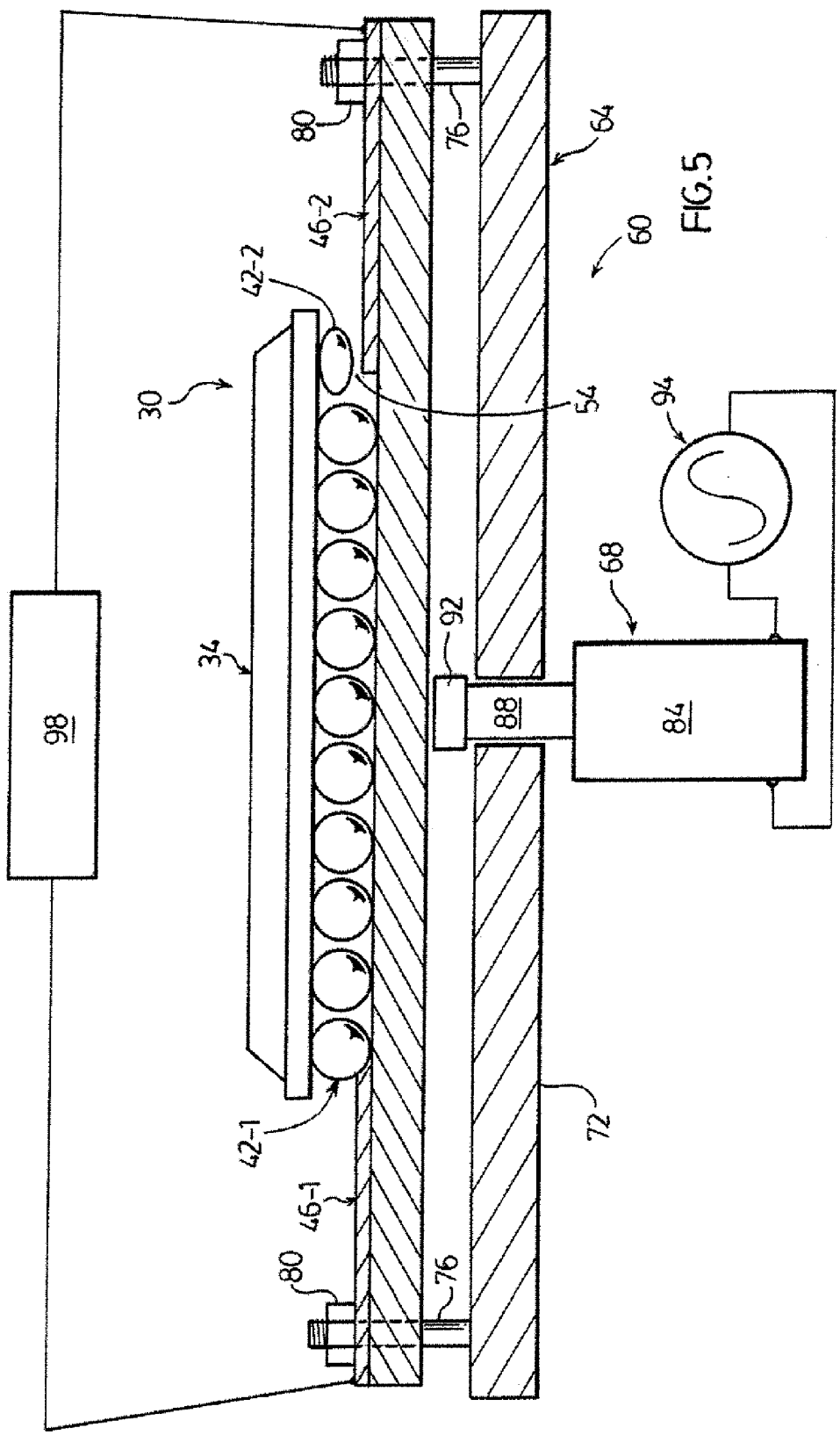
FIG. 5 is a sectional view of the assembly of FIG. 4 through the lines V-V of FIG. 4.

Referring now FIGS. 4 and 5, a fault detection apparatus in accordance with an embodiment is indicated generally at 60. In FIGS. 4 and 5, apparatus 60 is shown with assembly 30 mounted thereon. Assembly 30 is shown in FIG. 4 in dashed-lines in order that the features of apparatus 60 can be seen.

Apparatus 60 includes a jig 64 and at least one solenoid 68 or other type of mechanical actuator. Jig 64 is a mechanical fixture for securely retaining assembly 30 therein. Jig 64 thus includes a base-plate 72 having a size that substantially matches the size of assembly 30. Jig 64 also includes four mounting-posts 76 at each corner, which are positioned in a complementary manner to mounting-holes 50. Mounting-posts 76 include threaded crown nuts 80 which can be removed from mounting-posts 76 in order to place assembly 30 into position. Crown nuts 80 can then be reattached to mounting-posts 76 in order to securely fasten assembly 30 onto apparatus 60. As one example of how crown nuts 80 can be configured, mounting-posts 72 can include a set of male-threads (not shown), complementary to female threads (not shown) on crown nuts 80, so that crown nuts 80 can be tightened and thereby securely affix assembly 30 to jig 64. In general, it should be understood that jig 74 can be configured with other types of fasteners, in lieu of or in addition to mounting-posts 76 and crown nuts 80. Such other fasteners can include regular nuts, or a completely different mounting system altogether, such as clamps. The type of fastener that can be chosen for a particular jig, and overall structure of the jig, will typically complement the form factor of the corresponding circuit board assembly being securely attached thereon.

Solenoid 68 includes a coil portion 84 and a movable rod 88 that can be reciprocated between a retracted position and an extended position by applying a frequency signal from a signal generator 94 to coil portion 84. Rod 88 also includes a cap 92 which is typically made from a material, typically non-metallic, that meets Electrostatic Compatibility standards. An exemplary suitable solenoid can be a DC 24V Pull Open Frame solenoid identified with part number JMB-2243B-1 sourced from Sayal Electronics, 3791 Victoria Park Avenue, Toronto, Ontario, Canada, M1W 3K6 and manufactured by Guardian Electric under Part number 26-I-24VDC, from Guardian Electric Manufacturing, 1425 Lake Avenue, Woodstock, Ill. 60098.

As can be best seen in FIG. 5, rod 88 passes through a hole within base-plate 72 such that rod 88 is oriented directly below the centre of BGA 42. Also as shown in FIG. 5, a controller 98 is connected to traces 46 in an attempt provide an electrical test signal recognizable to IC 34. Controller 98 is associated with an output device in order to monitor whether the applied electrical test signal is producing an expected response from IC 34.

In operation, circuit board assembly 30 is affixed within jig 64 as shown in FIGS. 4 and 5, by first removing crown nuts 80 and lining up mounting-holes 50 with mounting-posts 76 and resting circuit board 38 on mounting-posts 76.

Next, crown nuts 80 are firmly fastened to mounting-posts 76 thereby securing board 38 firmly to jig 64.

A frequency is applied from signal generator 94 to coil portion 84, causing rod 88 to reciprocate and cap 92 to engage with board 38 and thereby mechanically disturb the mechanical interface between balls 42 and traces 46. In particular, the gap 54 will be disturbed and will serve to influence the intermittent electrical contact between ball 42-2 and trace 46-2. In certain tests, a frequency of about 120-170 Hz has been found to be beneficial in detecting faults such as gap 54. More preferably, a frequency of about 130-160 Hz has been found beneficial in detecting faults such as gap 54. More preferably, a frequency of about 150 Hz has been found beneficial in detecting faults such as gap 54.

In addition to the frequency applied by generator 94, a test signal is applied by a controller 98 to traces 46. In the specific example discussed, generator 94 would apply a signal to trace 46-2, and examine results of the test signal. The disturbance caused by solenoid 68 will, in a many circumstances, sufficiently disturb the interface between ball 42-2 and trace 46-2 such that the electrical contact therebetween will be interrupted and reveal gap 54.

The order in which the frequency is applied by generator 94, and the test signal is applied by controller 98 is not particularly material.

Figure 6:
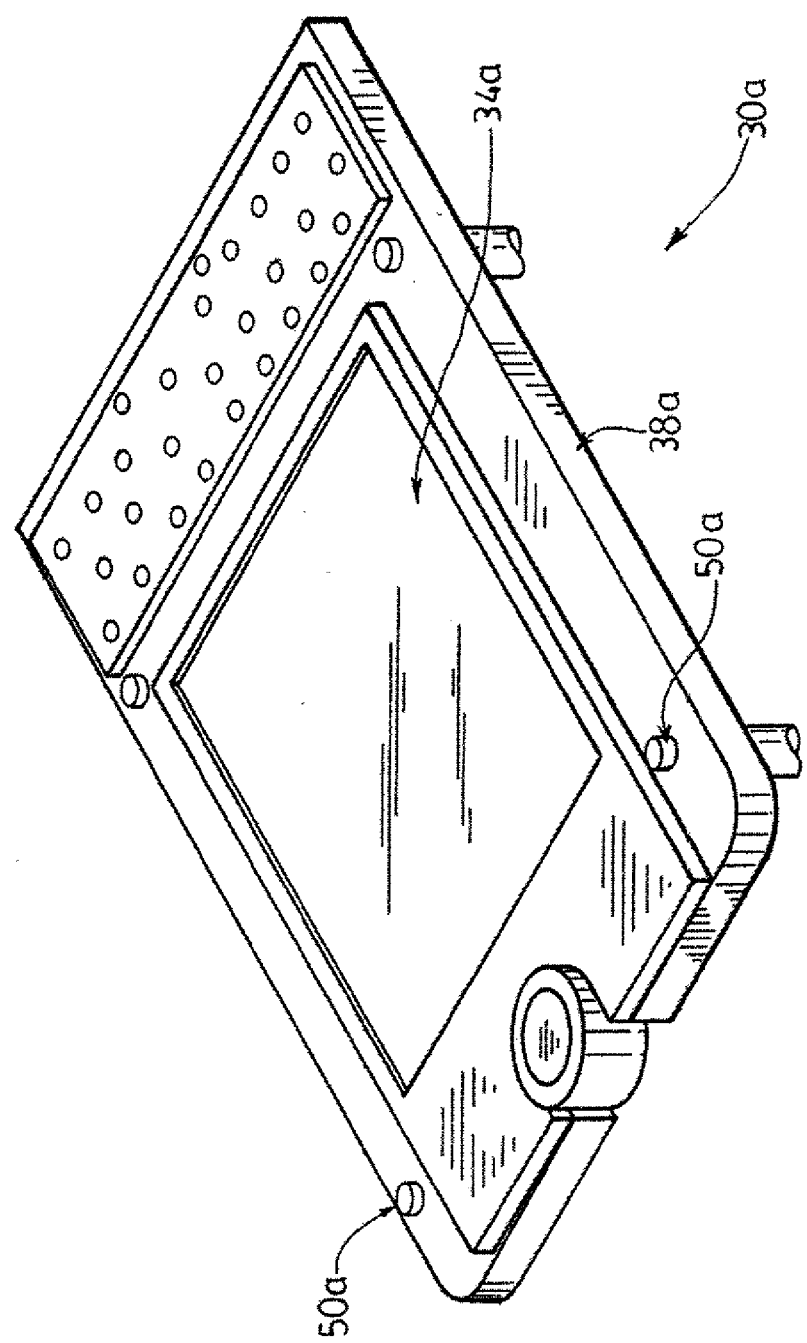
FIG. 6 is a schematic representation of another circuit board assembly including at least one integrated circuit having a ball grid array mounted on a circuit board.

Referring now to FIG. 6, another circuit board assembly including at least one integrated circuit having a ball grid array mounted on a circuit board is indicated generally at 30a. Assembly 30a includes many like elements to apparatus 30, and accordingly, like elements include like reference characters, except followed by the suffix "a". Assembly 30a is a complete assembly of the internal components that comprise a wireless email-telephony device. In FIG. 6, assembly 30a includes a plurality of ICs, but only one is shown and is labeled at 34a. IC 34a, in the present exemplary embodiment, is the display of the wireless email-telephony device. (Note that in other embodiments, the display of a device is connected via ribbon to a connector mounted on the PCB, and via this connector and PCB traces the display is connected to and controlled by a BGA which can be tested using the teachings herein.) Assembly 30a also includes a plurality of mounting holes 50a that are disposed within circuit board 38a.

Figure 7:
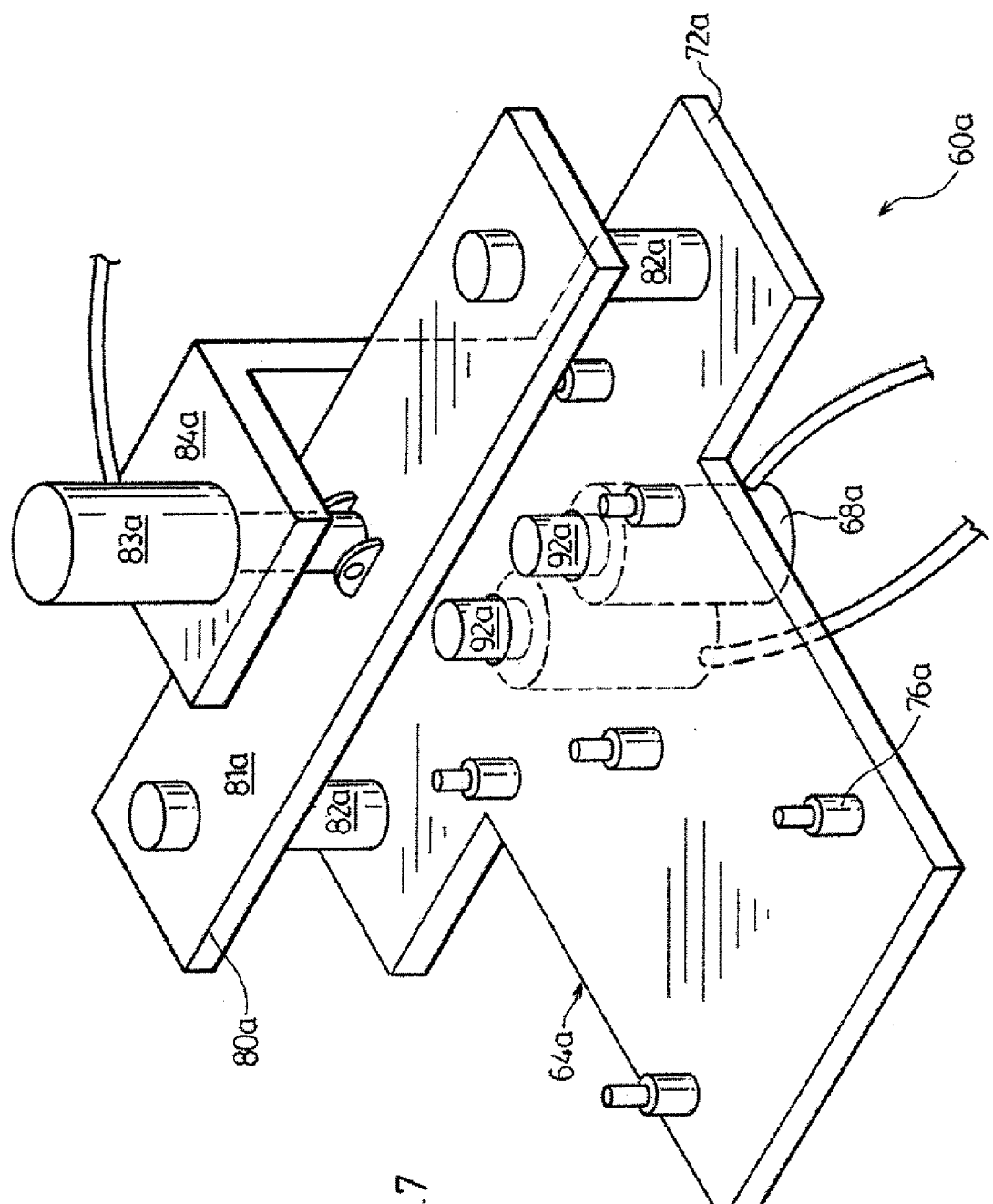
FIG. 7 is a top perspective view of another fault detection apparatus for use in conjunction with the circuit board assembly of FIG. 6.
Figure 8:
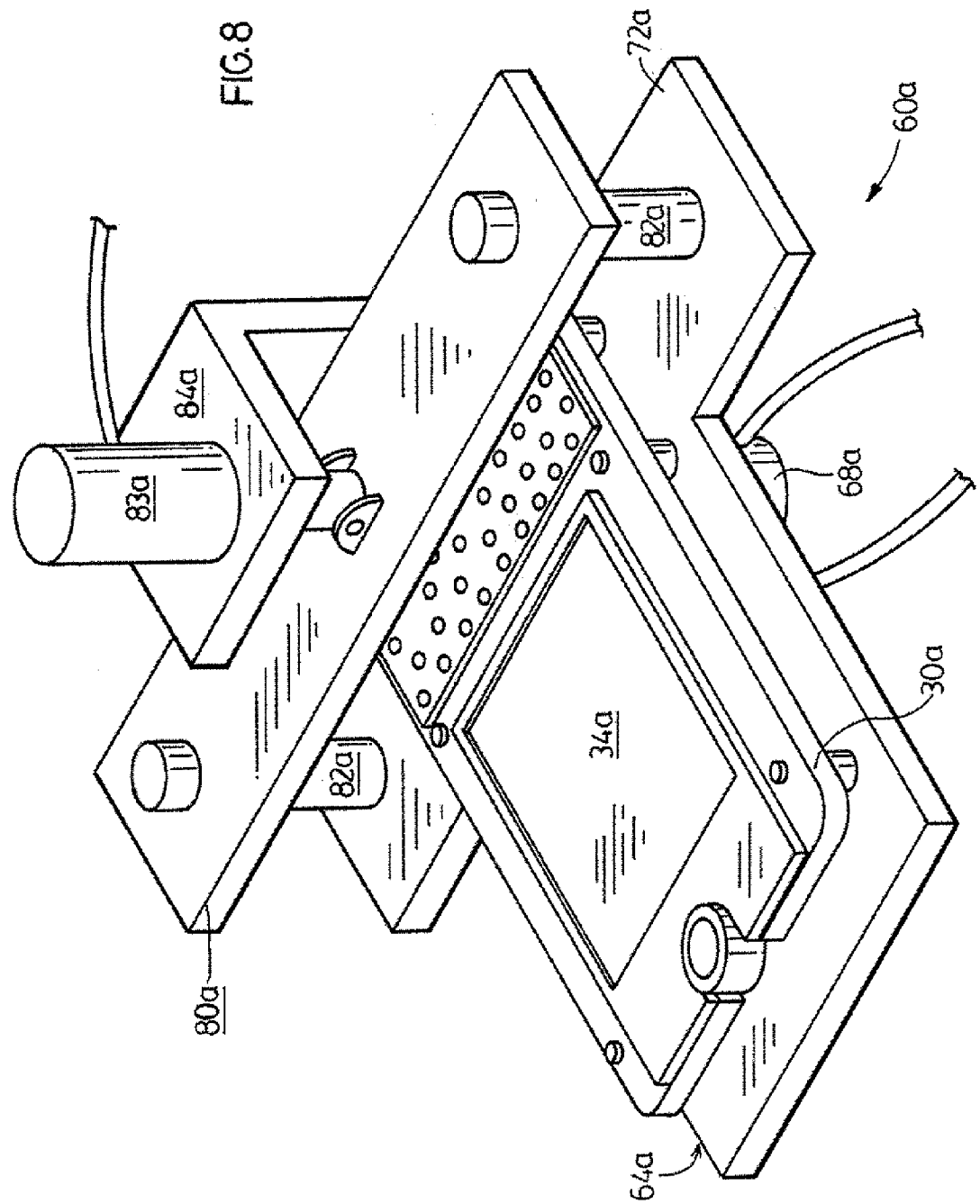
FIG. 8 shows the fault detection apparatus of FIG. 7 with the circuit board assembly of FIG. 6 mounted thereon and the clamp of the apparatus in the open position.
Figure 9:
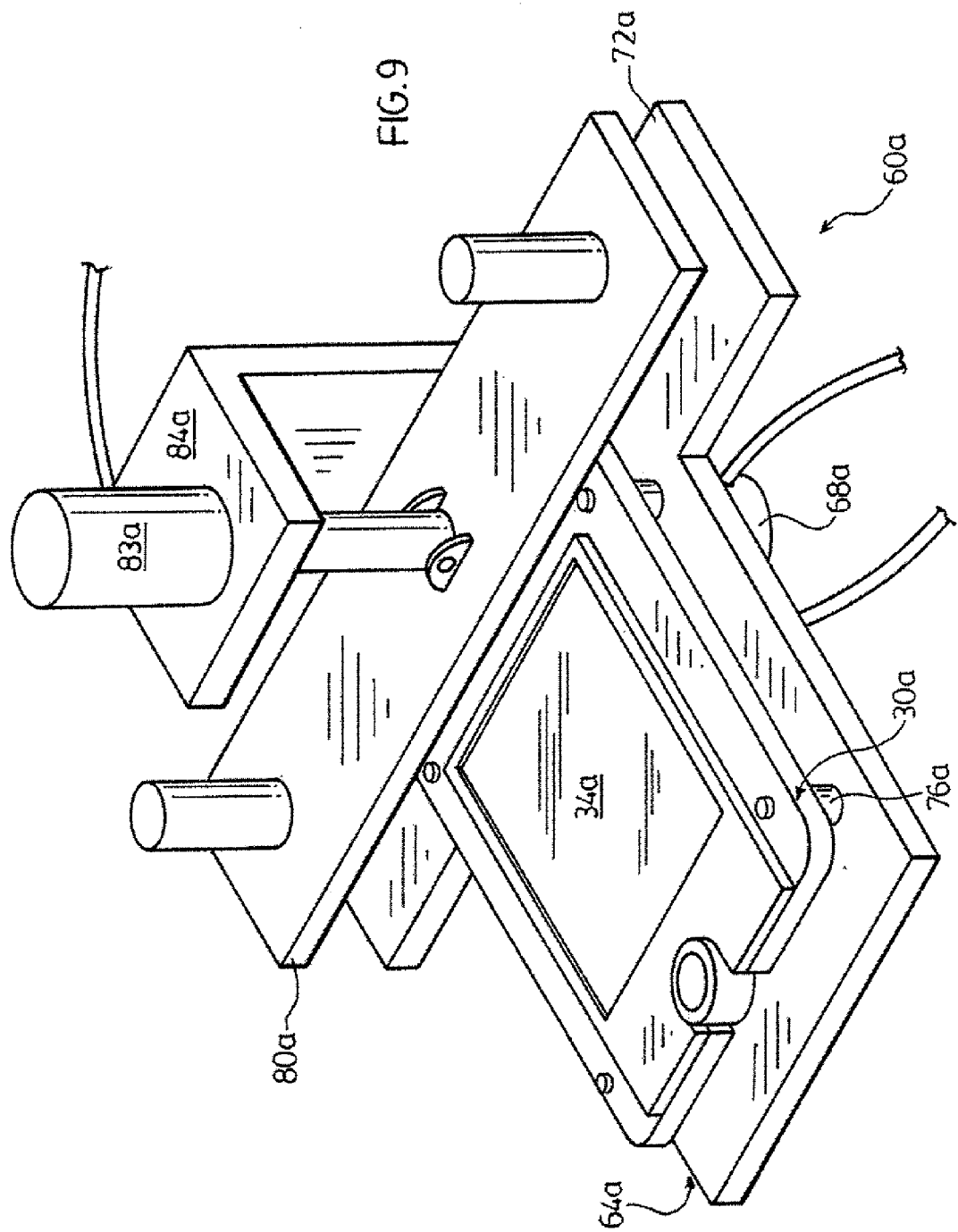
FIG. 9 shows the fault detection apparatus and circuit board assembly of FIG. 8 with the circuit board assembly secured within the fault detection apparatus with the clamp of the apparatus in the closed position.

Referring now to FIGS. 7-9, a fault detection apparatus in accordance with another embodiment is indicated generally at 60a. Apparatus 60a includes many like elements to apparatus 60, and accordingly, like elements include like reference characters, except followed by the suffix "a". Apparatus 60a thus includes a jig 64a that includes a base plate 72a and a plurality of mounting posts 76a onto which assembly 30a can be mounted via complementary mounting holes 50a. FIG. 7 shows apparatus 60a without assembly 30a mounted on jig 64a, whereas FIGS. 8-9 show apparatus 60a mounted on jig 64a.

In contrast to apparatus 60, apparatus 60a does not include crown nuts 80 but instead includes a clamp 80a which has an open position shown in FIGS. 7 and 8 for mounting and dismounting assembly 30a onto jig 64a, and a secured position shown in FIG. 9 for securing assembly 30a within jig 64a. The clamp includes a cross-beam 81a that is slidable from a raised position to a lowered position along a pair of shafts 82a. A piston 83a mounted to an L-bracket 84a attaches to crossbeam 81a and can be powered to raise and lower cross-beam 81a.

Also in contrast to apparatus 60, apparatus 60a includes two solenoids 68a, best seen in FIG. 7. Likewise, apparatus 60a includes two corresponding caps 92a which come into contact with circuit board assembly 30a. In a present embodiment, there are two solenoids so that two BGA's can be tested simultaneously. Many tests can be run that cause the interaction between the two BGA's, so testing both at the same time can effect more tests on more balls in less time than testing individually. The solenoids can be selected to be at different heights because the BGA packages can be different thicknesses and therefore the stand-off from the circuit board can be different, thus requiring different heights of the solenoid to effect contact with the BGA being tested.

While only one IC is shown in FIG. 6, advantageously a number of ICs in assembly 30a can be tested using apparatus 60a without destroying or disassembly of assembly 30a.

Not shown in FIGS. 7-9 is a controller like controller 98. Also advantageously, controller 98 in apparatus 60a can be effected by simply using the workings of assembly 30a. In other words, assembly 30a can be "powered-up" when it is securely mounted in apparatus 60a and, by applying vibrations via solenoids 68a, any defects or faults in BGAs associated with ICs in assembly 30a can be detected as attempts are made to normally operate assembly 30a. However, if desired, a separate controller like controller 98 can be applied to apparatus 60a to provide further control over ICs within assembly 30a and therefore perform additional tests. Peripherals can also be tested, and display 34a being attached not only serves for easy user interface but also allows testing of the display circuit at the same time. Also, by loading software onto assembly 30a, one can test memory connections to flash IC's. Likewise keypads can be tested. Essentially, any user interface that an operator can interact with manually or using test equipment can be tested.

However, tests using a controller like controller 98 can be implemented to cover almost all connections under a BGA by adding radio frequency testing and audio loopback testing as required while exciting the BGA using solenoids 68a.

While the foregoing embodiments discuss certain features and specific implementations, it is to be understood that combinations, subsets and variations of those embodiments are contemplated. For example, in assembly 50 a gap 54 was illustrated, however, the teachings herein can be used to detect other types of faults that can result in intermittent or failed electrical contact.

It should also be understood that the exact configuration and structure of the fault detection apparatus can be chosen based on the particular circuit board assembly that is being tested. The configuration of the jig, the type of clamps used, the size, number and orientation of the solenoids, the frequency at which the solenoid(s) operate, the amount of deflection in the circuit board, can all be selected according to the circuit board assembly being tested. Indeed, in certain configurations even the ranges of frequencies suitable for fault detection can be different than the ranges identified above. It can be desired to iteratively adjust these and various other parameters of the fault detection apparatus by using both sample circuit board assemblies which have failed, and which have not failed, in order to determine a preferred or otherwise desired configuration of a fault detection apparatus. More complex fault detection apparatuses can be developed to allow for all BGAs on one populated circuit board to be tested in parallel.

The invention claimed is:

1. A fault detection apparatus for detecting a fault in a surface mount package of a circuit board assembly; said circuit board assembly comprising an electrical component mounted to a surface of a circuit board via said surface mount package; said apparatus comprising:

a retainer for releasably securing said circuit board assembly;

at least one solenoid comprising a core portion and a rod; said rod movable between a retracted position and an extended position; said rod being disposed in relation to said circuit board such that changing between said positions causes deflections in said circuit board; said rod disposed beneath said surface mount package;

said at least one solenoid for applying a mechanical force to said circuit board when said circuit board assembly is secured within said retainer and while a test signal is passed through said circuit board; said mechanical force for disturbing a mechanical defect in said surface mount package to thereby reveal, using results from said test signal, an electrically intermittent connection in said surface mount package.

2. The fault detection apparatus of claim 1 wherein said surface mount package is a ball grid array.

3. The fault detection apparatus of claim 1 wherein said rod includes a cap made from an Electrostatic Compliant material.

4. The fault detection apparatus of claim 1 further comprising a signal generator for applying a varying signal to said solenoid to cause said rod to cycle between said positions.

5. The fault detection apparatus of claim 4 wherein said signal generator operates at a frequency of between about 120 and 170 Hz.

6. The fault detection apparatus of claim 4 wherein said signal generator operates at a frequency of between about 130 and 160 Hz.

7. The fault detection apparatus of claim 4 wherein said signal generator operates at a frequency of about 150 Hz.

8. The fault detection apparatus of claim 1 wherein said mechanical actuator includes a plurality of solenoids.

9. The fault detection apparatus of claim 1 wherein said circuit board assembly includes a plurality of electrical components mounted via a respective surface mount package.

10. The fault detection apparatus of claim 9 further comprising a plurality of mechanical actuators respective to one or more of said electrical components.

11. The fault detection apparatus of claim 1 wherein said retainer includes a base plate.

12. A fault detection apparatus for detecting a fault in a surface mount package of a circuit board assembly; said circuit board assembly comprising an electrical component mounted to a surface of a circuit board via said surface mount package; said apparatus comprising:

a retainer for releasably securing said circuit board assembly; said retainer including a base plate; said base plate including a plurality of mounting-posts projecting from said base-plate that align with a corresponding plurality of mounting-holes in said circuit board; and a mechanical actuator for applying a mechanical force to said circuit board when said circuit board assembly is secured within said retainer and while a test signal is passed through said circuit board; said mechanical force for disturbing a mechanical defect in said surface mount package to thereby reveal, using results from said test signal, an electrically intermittent connection in said surface mount package.

13. The fault detection apparatus of claim 12 wherein said mounting posts include a male thread that projects above said mounting-holes and wherein said retainer further includes a plurality of crown nuts with female threads complementary to said male threads; said crown nuts for securing said circuit board to said mounting posts.

14. The fault detection apparatus of claim 12 wherein said retainer further comprises a clamp for applying a force to said circuit board and thereby secure said circuit board between said clamp and said base plate.

15. A method for detecting for detecting a fault in a surface mount package of a circuit board assembly; said circuit board assembly comprising an electrical component mounted to a surface of a circuit board via said surface mount package; said method comprising:

securing said circuit board assembly within a retainer;

applying a test signal through said circuit board;

applying a mechanical force to said circuit board for disturbing any mechanical defects in said surface mount package; said mechanical force being applied by at least one solenoid comprising a core portion and a rod; said rod movable between a retracted position and an extended position; said rod being disposed in relation to said circuit board such that changing between said positions causes deflections in said circuit board; said rod disposed beneath said surface mount package; and, using results from said test signal, revealing an electrically intermittent connection in said surface mount package as a result of said step of applying said mechanical force.

* * * * *